(12) United States Patent
Bodenstab (10) Patent No.: US 6,563,360 B1
(45) Date of Patent: May 13, 2003

(54) SYSTEM FOR CONTROLLING ELECTRICAL SIGNAL LEVEL

(75) Inventor: Paul Robert Bodenstab, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/046,842

(22) Filed: Jan. 15, 2002

(51) Int. Cl.[7] .................................. H03K 5/08
(52) U.S. Cl. .................. 327/313; 327/309; 327/318
(58) Field of Search ................. 327/309, 315, 327/318, 321, 324, 325, 327, 328, 331, 313

(56) References Cited

U.S. PATENT DOCUMENTS

| | | | |
|---|---|---|---|
| 4,760,433 A | * 7/1988 | Young et al. | 257/357 |
| 5,821,797 A | * 10/1998 | Kinugasa et al. | 327/318 |
| 5,942,931 A | * 8/1999 | Yanai | 327/313 |
| 6,218,881 B1 | * 4/2001 | Hiraga | 327/309 |
| 6,271,692 B1 | * 8/2001 | Iihoshi et al. | 327/309 |
| 6,333,661 B1 | * 12/2001 | Ando et al. | 327/312 |

OTHER PUBLICATIONS

US patent application Publication No. US 2002/0000864 A1, Fujita et al., Jan. 3, 2002.*

* cited by examiner

Primary Examiner—Toan Tran (57) ABSTRACT

A system embodiment for controlling an electrical signal level has a first and a second switch, with one of the switches connected to a high voltage source and the other connected to a low voltage source. One of the switches is biased to an on position when the voltage is less than the low level, with the signal increasing to a level of at least the low level while the switch is biased to the on position. The other of the switches is biased to an on position when the signal is greater than the high level, with the signal discharging to at least below the high level while the switch is in the on position.

10 Claims, 4 Drawing Sheets

SYSTEM FOR CONTROLLING ELECTRICAL SIGNAL LEVEL

FIELD OF THE INVENTION

The present invention is related to electronic circuitry. More particularly, the present invention is related to systems for regulating the voltage level of a signal.

BACKGROUND OF THE INVENTION

The last few decades have witnessed unprecedented growth in the use of integrated electronic circuitry. This rapid growth has been accompanied by a steadily decreasing physical size and a steadily increasing complexity of circuits. Physically smaller circuits are advantageous in that they may be used in many applications that would have been impractical or even impossible in the past. Also, decreasing circuit size has led to smaller amounts of materials required for fabrication, which drives down costs and decreases the price/performance ratio of circuits.

Designing and building circuits on small physical scales presents numerous technological challenges. For example circuit behavior can deviate significantly from the ideal as feature sizes shrink. On smaller scales, signal wires on a chip can couple to neighboring signal wires by both capacitive and inductive means. When these wires are used to transfer signals that have very fast edge rates these coupling mechanisms can cause distortions in the signals of neighboring wires that in turn can cause logic failures. Such effects are becoming particularly frequent on highly dense, highly miniaturized circuits such as very large scale integrated ("VLSI") circuits used on chips and the like.

One of the logic failure distortions that can result from improperly coupled signal wires is deviation of a logic signal outside of its normal range of voltage levels. This deviating signal may be misinterpreted by a logic gate as a logic 'one' level instead of a logic 'zero' or vice versa. In extreme cases, the signal deviation may be so excessive so that the resulting voltage level is such that it can cause permanent damage to the circuit.

The prior art has proposed methods for ensuring and maintaining circuit signal quality. For example, one prior art method comprises carefully controlling the use of line widths and spaces when designing an integrated circuit. Through such control, a circuit designer can, in theory, control the worst-case amount of capacitive or inductive coupling to neighboring wires and thus insure worst-case bounds of signal behavior. While this practice may be practical for simple circuits, the method has proven much more difficult to use for circuits of appreciable size and complexity. Also, controlling line widths and spaces to control coupling problems often results in using wire resources in less than the available density. Further, manufacturing tolerances for highly miniaturized circuits may additionally limit the usefulness of this method. Another prior art method involves judicious control of location of signals to minimize the routing of critical signals near to one another. Unfortunately, this method also has proven impractical for use with circuits of an appreciable size and complexity due to the enormous resources required for mapping the physical location and modeling the operation of the various signals and components in such circuits.

Unresolved needs in the art therefore exist.

SUMMARY OF THE INVENTION

The present invention is directed to a system for controlling the level of an electrical signal between a high and a low level. A system embodiment of the invention generally comprises a first switch connected to the signal and connected to at least a high voltage source, and a second switch connected to the signal and connected to at least a low voltage source. The high voltage source is substantially equal to the high level, while the low voltage source is substantially equal to the low level. One of the switches is biased to an on position when the signal is less than the low level whereby the signal will increase in voltage until it is at least substantially equal to the low level. The other of the switches is biased to an on position when the signal is greater than the high level whereby it will decrease in voltage until it is substantially equal to the high level.

The present invention thereby provides an elegant solution to many unresolved problems in the art. As an example, systems of the invention can be used on integrated circuits to insure that signals remain within a desired range, with potential cross-signal capacitance/inductance failures significantly reduced. Further, use of embodiments of the invention provides low cost alternative that can reduce or even eliminate the need to use cumbersome and intensive prior art methods of avoiding cross-signal capacitance/conductance failures.

The above brief description sets forth broadly some of the features and advantages of the present disclosure so that the detailed description that follows may be better understood, and so that the present contributions to the art may be better appreciated. There are, of course, additional features of the disclosure that will be described hereinafter that form the subject matter of the claims appended hereto. In this respect, before explaining embodiments of the disclosure in detail, it is to be understood that the disclosure is not limited in its application to the details of the construction set forth in the following description or illustrated in the drawings. The present invention may provide additional embodiments, as will be appreciated by those knowledgeable in the art. Also, it is to be understood that the phraseology and terminology employed herein are for description and not limitation.

DETAILED DESCRIPTION

Figure 1:
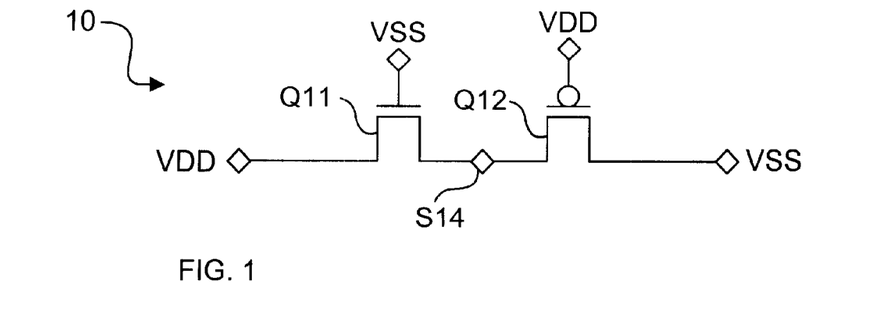
FIG. 1 is a schematic of one system embodiment of the invention.

Turning now to the FIGS. by way of illustration of the best-known modes of the invention, FIG. 1 is a schematic illustrating one embodiment 10 of a system of the invention. The circuit embodiment 10 generally comprises a signal S14 that is connected to a first switch Q11 and a second switch Q12. It is noted that as used herein the term "switch" is intended to broadly refer to any device useful for substantially making, breaking, or changing an electrical connection. Preferred switches for practice of the present invention comprise transistors, with field effect transistors ("FET") most preferred. Those knowledgeable in the art will appreciate that FET's may comprise n-channel or p-channel transistors, and that FET connections may be referred to as a source, a drain, and a gate. In the circuit embodiment 10 of the invention, the transistor Q11 comprises an n-channel FET, with a high level voltage VDD connected to its drain, a low level voltage VSS connected to its gate, and the signal S14 connected to its source. The transistor Q12 preferably comprises a p-channel FET having the low level voltage VSS connected to its drain, the signal S14 connected to its source, and the high level voltage VDD connected to its gate.

In the embodiment 10, the transistor Q11 is biased off when the signal S14 is greater than the low level voltage VSS plus its threshold voltage VT, and is biased on when the signal S14 is less than the low level voltage plus the threshold voltage VT. It is noted that as used herein the term "on" when used in reference to a switch is intended to broadly refer to a condition of a continuous or "closed" circuit that is capable of conducting current. Conversely, the term "off" is intended to broadly refer to the opposite condition of a broken or "open" circuit that is not capable of conducting appreciable current (neglecting leakage losses and the like). The n-channel FET Q11 operates to "turn" on when the source voltage level of the signal S14 is less than the low level voltage VSS connected to its gate minus the threshold voltage $VT_{Q11}$. As will be appreciated by those knowledgeable in the art, the threshold voltage VT may be thought of as the marginal amount of voltage below the gate voltage for triggering the respective transistor "on." When the FET Q11 is thus on, the current will flow from the high level voltage VDD to the signal S14 until the signal S14 is charged back up to the level of the low level voltage VSS less the threshold voltage $VT_{Q11}$.

The p-channel FET Q12 has the signal S14 connected to its source, the high level voltage VDD connected to its gate, and the low level voltage VSS connected to its drain. The FET Q12 is biased off as long as the voltage on S14 is less than VDD plus $VT_{Q12}$. Conversely, the FET Q12 will be biased on when the signal S14 is greater than the high level voltage VDD plus the threshold voltage of the FET Q12 ($VT_{Q12}$). That is, the p-channel FET Q12 will operate to compare the signal S14 level connected to its source to the high level voltage VDD connected to its gate, and will "turn on" when the signal S14 is greater than the gate level VDD plus the threshold voltage $VT_{Q12}$. When the FET Q12 is in the on position, current will flow from S14 to VSS, thus removing charge from S14 and lowering its voltage. Once the voltage level of signal S14 is less than or equal to VDD plus $VT_{Q12}$ the FET Q12 will turn "off."

The following operations table summarize the operations of the transistors Q11 and Q12 in relation to the values of the high level voltage VDD, the low level voltage VSS, and the signal S14 (ignoring for convenience the threshold voltages of the transistors Q11 and Q12):

TABLE 1

Circuit Embodiment 10 Operations

| Condition: | Q11 State: | Q12 State: | Result: |
|---|---|---|---|
| S14 > VDD, S14 > VSS | OFF | ON | S14 Discharges to VSS |
| S14 < VDD, S14 < VSS | ON | OFF | S14 Charges to VDD |
| VDD > S14 > VSS | OFF | OFF | (No current) |

In this manner the system embodiment 10 will operate to maintain the signal S14 at a voltage level between the high level voltage VDD and the low level voltage VSS. That is, the system embodiment 10 will operate to maintain:

$$(VDD+VT_{Q12})>S14>(VSS-VT_{Q11})$$

Those knowledgeable in the art will appreciate that there are a number of other switch/signal/switch configurations possible within the practice of the invention that will accomplish the maintenance of a signal between a desired high and low voltage. By way of example, reference is made to the schematics of FIGS. 2–10 illustrating additional example embodiments 20–100, respectively, of the present invention for maintaining a signal between a high level voltage VDD and a low level voltage VSS.

It is noted that in the discussion herein regarding various embodiments of the invention, the threshold voltage VT of the various transistors may be ignored for convenience. Nonetheless, those skilled in the art will appreciate that switches such as the preferred FET's used in practice of embodiments of the invention preferably utilize threshold voltages. Alternatively, it may be assumed that the threshold voltages are accounted for in the high and low levels that invention embodiments are operating to maintain. That is, it may be assumed for convenience that the high level and low levels are equal to the respective voltage sources in combination with the threshold voltage of a respective of the FET's:

high level=$(VDD+VT_Q)$ low level=$(VSS-VT_Q)$

For discussion herein, it is intended that a voltage being "substantially equal" to a high or low level may include these relations. For example, as used herein the high voltage source VDD being "substantially equal" to the high level may comprise the relation:

high level=$(VDD+VT_Q)$

Figure 2:
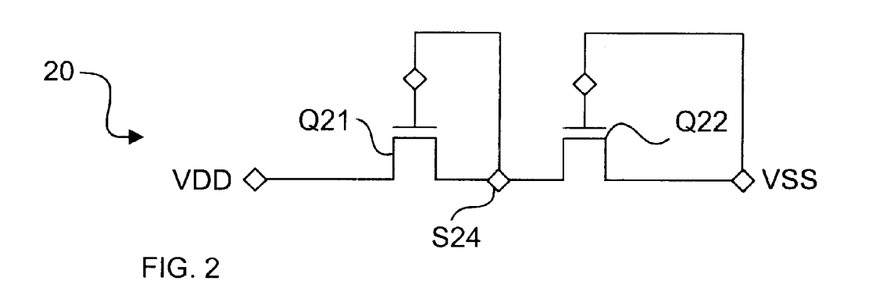
FIG. 2 is a schematic of an additional system embodiment of the invention.

Referring again to the FIGS., the circuit embodiment 20 illustrated in FIG. 2 comprises an n-channel FET Q21 and a second n-channel FET Q22. The FET Q21 has its gate connected to the signal S24, while the second FET Q22 has its gate connected to the low level voltage VSS. Those knowledgeable in the art will appreciate that the embodiment 20 as illustrated will have the following operations (ignoring the threshold voltage of the FETS Q21 and Q22):

TABLE 2

System Embodiment 20 Operations

| Condition: | Q21 State: | Q22 State: | Result: |
|---|---|---|---|
| S24 > VDD, S24 > VSS | ON | OFF | S24 discharges to VDD |
| S24 < VDD, S24 < VSS | OFF | ON | VSS charges S24 |
| VDD > S24 > VSS | OFF | OFF | (No Current Flows) |

Figure 3:
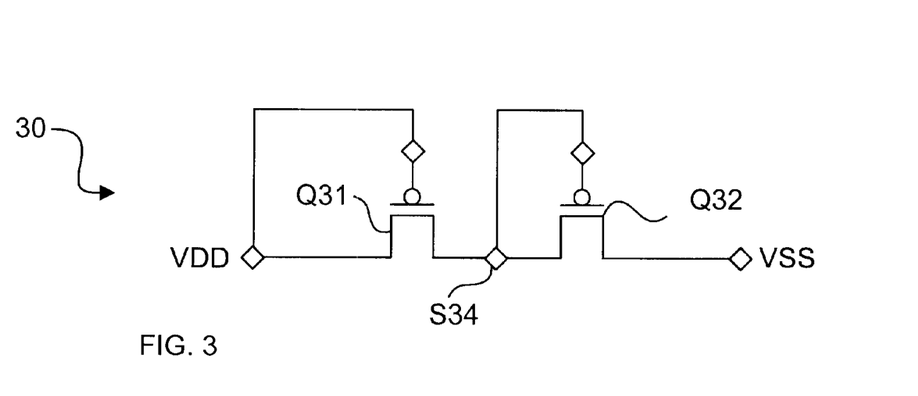
FIG. 3 is a schematic of an additional system embodiment of the invention.

The schematic of FIG. 3 illustrating system circuit 30 shows a p-channel FET Q31 having its gate connected to the high level voltage, and a second p-channel FET Q32 having its gate connected to the signal S34. Those knowledgeable in the art will appreciate that the embodiment 30 as illustrated will have the following operations (ignoring the QFET Q31 and Q32 threshold voltages):

TABLE 3

System 30 Embodiment Operations

| Condition: | Q31 State: | Q32 State: | Result: |
|---|---|---|---|
| S34 > VDD, S34 > VSS | ON | OFF | S34 discharges to VDD |
| S34 < VDD, S34 < VSS | OFF | ON | VSS charges S34 |
| VDD > S34 > VSS | OFF | OFF | (No Current Flows) |

Figure 4:
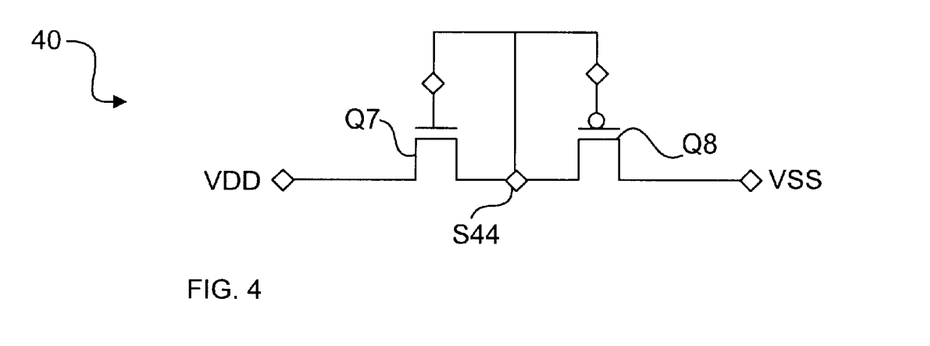
FIG. 4 is a schematic of an additional system embodiment of the invention.

The system embodiment 40 illustrated by FIG. 4 has an n-channel FET Q41 and a p-channel FET Q42, with each having their gates connected to the signal S44. Accordingly, those skilled in the art will appreciate that the embodiment 40 will have operations that may be summarized as follows (ignoring threshold voltages of the FET's Q41 and Q42):

TABLE 4

System Embodiment 40 Operations

| Condition: | Q41 State: | Q42 State: | Result: |
|---|---|---|---|
| S44 > VDD, S44 > VSS | ON | OFF | S44 discharges to VDD |
| S44 < VDD, S44 < VSS | OFF | ON | VSS charges S44 |
| VDD > S44 > VSS | OFF | OFF | (No Current Flows) |

Figure 5:
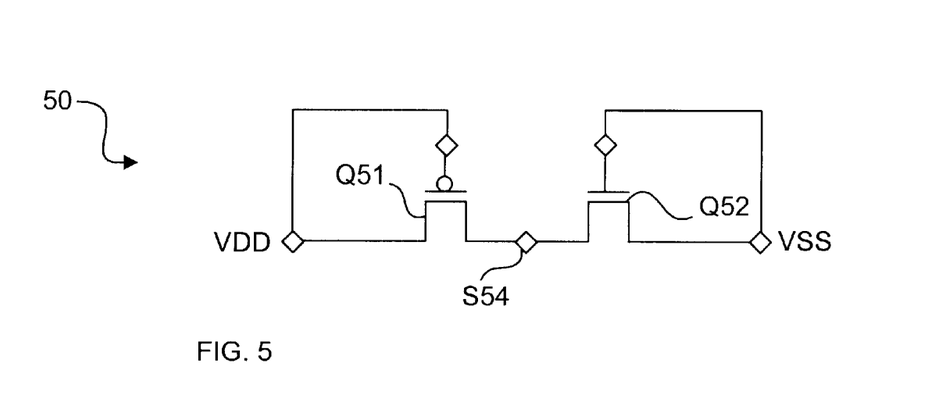
FIG. 5 is a schematic of an additional system embodiment of the invention.

FIG. 5 illustrates still another system embodiment 50 having a p-channel FET Q51 with its gate connected to the high level voltage source VDD, and having an n-channel FET Q52 with its gate connected to the low level voltage source VSS. Those skilled in the art will understand that the configuration as illustrated for circuit 50 will have the following operations (ignoring the QFET Q51 and Q52 threshold voltages):

TABLE 5

System Embodiment 50 Operations

| Condition: | Q51 State: | Q52 State: | Result: |
|---|---|---|---|
| S54 > VDD, S54 > VSS | ON | OFF | S54 discharges to VDD |
| S54 < VDD, S54 < VSS | OFF | ON | VSS charges S54 |
| VDD > S54 > VSS | OFF | OFF | (No Current Flows) |

Figure 6:
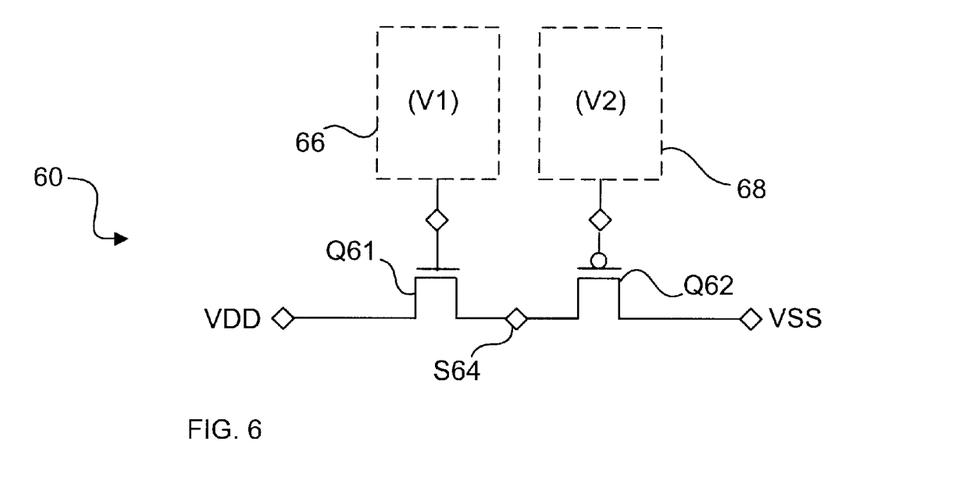
FIG. 6 is a schematic of an additional system embodiment of the invention.

FIG. 6 is a schematic showing an additional embodiment 60 of the invention. The embodiment 60 comprises an n-channel FET Q61 with its gate connected to a reference low-level voltage V1 generating circuit 66, and a p-channel FET Q62 connected to a reference high-level voltage V2 generating circuit 68. The reference generating circuits 66 and 68 may be any of a number of generally known circuits for generating a reference voltage. The reference voltages V1 and V2 may of course be set to any desired limit, including by way of example to VSS and VDD, respectively. It will be appreciated that many embodiments of the invention may utilize reference voltage generating circuits connected to the gates of the transistors. Indeed, the gate connections of any of the embodiments illustrated in the FIGS. could be made to reference circuits as an alternative to the high and low voltage sources VDD and VSS. Accordingly, it will be appreciated that as used herein the term "voltage source" may comprise a reference voltage generating circuit. Those skilled in the art will appreciate that the embodiment 60 will have the following operations (ignoring the QFET Q61 and Q62 threshold voltages):

TABLE 6

System Embodiment 60 Operations

| Condition: | Q61 State: | Q62 State: | Result: |
|---|---|---|---|
| S64 > V2, S64 > V1 | OFF | ON | S64 discharges to VSS |
| S64 < V2, S64 < V1 | ON | OFF | VDD charges S64 |
| V2 > S64 > V1 | OFF | OFF | (No Current Flows) |

Figure 7:
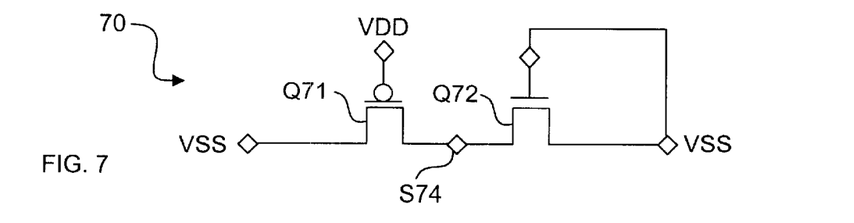
FIG. 7 is a schematic of an additional system embodiment of the invention.

FIG. 7 is a schematic showing an additional embodiment 70 of the invention. The embodiment 70 comprises a p-channel FET Q71 with its gate connected to the high voltage source VDD, and its drain connected to the low voltage source VSS. An n-channel FET Q72 connected has its gate connected to the low level voltage source VSS, which is also connected to its drain. Accordingly, the embodiment 70 uses the low level voltage source VSS to both charge the signal and as a drain for the signal to discharge to. In particular, those skilled in the art will appreciate that the embodiment 70 will have the following operations (ignoring the QFET Q71 and Q72 threshold voltages):

TABLE 7

System Embodiment 70 Operations

| Condition: | Q71 State: | Q72 State: | Result: |
|---|---|---|---|
| S74 > VDD, S74 > VSS | ON | OFF | S74 discharges to VSS |
| S74 < VDD, S74 < VSS | OFF | ON | VSS charges S74 |
| VDD > S74 > VSS | OFF | OFF | (No Current Flows) |

Figure 8:
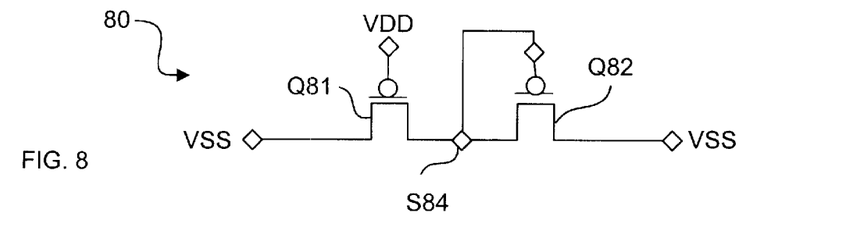
FIG. 8 is a schematic of an additional system embodiment of the invention.

FIG. 8 is a schematic of an additional invention embodiment 80 that like the embodiment 70 has the low voltage source VSS connected to the drains of both the first FET Q81 and the second FET Q82. The FET Q81 comprises a p-channel FET with its gate connected to the high voltage source VDD. The FET Q82 is also a p-channel FET, and has its gate connected to the signal S84. Those skilled in the art will appreciated that the embodiment 70 will have the following operations (ignoring the QFET Q81 and Q82 threshold voltages):

TABLE 8

System Configuration Embodiment 80 Operations

| Condition: | Q81 State: | Q82 State: | Result: |
|---|---|---|---|
| S84 > VDD, S84 > VSS | ON | OFF | S84 discharges to VSS |
| S84 < VDD, S84 < VSS | OFF | ON | VSS charges S84 |
| VDD > S84 > VSS | OFF | OFF | (No Current Flows) |

Figure 9:
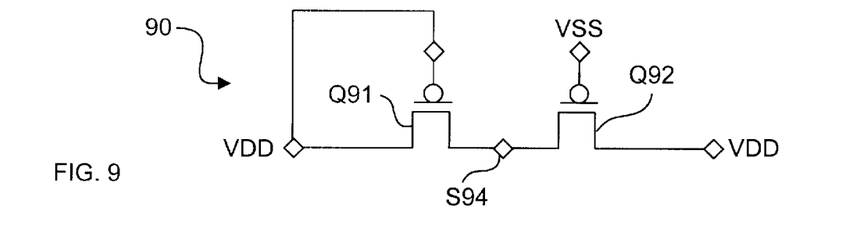
FIG. 9 is a schematic of an additional system embodiment of the invention.

The embodiment 90 shown in the schematic of FIG. 9 has first and second FET's Q91 and Q92 with their drains connected to the high voltage source VDD. The FET Q91 is a p-channel FET, with its gate connected the high voltage source VDD. The p-channel FET Q92 has its gate connected to the low level voltage source VSS. With the configuration as shown, those skilled in the art will appreciate that the embodiment 90 has the following operations (ignoring the QFET Q91 and Q92 threshold voltages):

TABLE 9

System Configuration Embodiment 90 Operations

| Condition: | Q91 State: | Q92 State: | Result: |
|---|---|---|---|
| S94 > VDD, S94 > VSS | ON | OFF | S94 discharges to VDD |
| S94 < VDD, S94 < VSS | OFF | ON | VDD charges S94 |
| VDD > S94 > VSS | OFF | OFF | (No Current Flows) |

Figure 10:
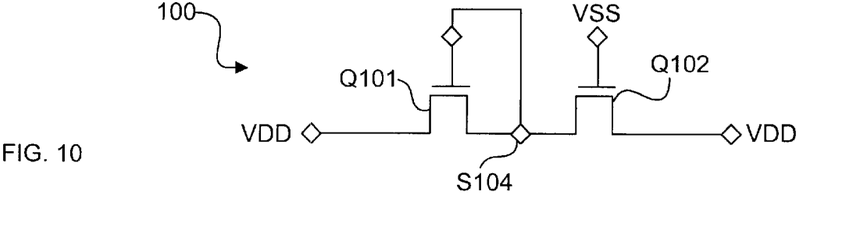
FIG. 10 is a schematic of an additional system embodiment of the invention.

The embodiment 100 of FIG. 10 has two FETS Q101 and Q202 connected to the high voltage source in the same manner as the embodiment 90. The n-channel FET Q101, however, operates with the high level voltage source as its source connection, with the signal S104 connected to its gate. The n-channel FET Q102 has its gate connected to the low level voltage source VSS. The embodiment 100 will be understood by those knowledgeable in the art to operate in the following manner (ignoring the QFET Q101 and Q102 threshold voltages):

TABLE 10

System Configuration Embodiment 100 Operations

| Condition: | Q101 State: | Q102 State: | Result: |
|---|---|---|---|
| S104 > VDD, S104 > VSS | ON | OFF | S104 discharges to VDD |
| S104 < VDD, S104 < VSS | OFF | ON | VDD charges S104 |
| VDD > S104 > VSS | OFF | OFF | (No Current Flows) |

Those knowledgeable in the art will appreciate that the example circuit embodiments 10–100 are but a few that are possible within practice of the present invention. All of these example circuits 10–100 have in common that they comprise first and second switches with at least one of the switches connected to a high voltage source and at least one of the switches connected to a low voltage source, with the switches being biased to maintain the relationship:

$$(VDD+VT_{Q\_2})>S14>(VSS-VT_{Q\_2})$$

Of the example embodiments 10–100, it will be appreciated by those skilled in the art that the embodiment 10 may be particularly desirable in many applications as it will provide for the largest current flow through the transistors Q11 and Q21 when they are in an on state as a result of the large gate to source and drain to source voltage differences.

The example embodiments 10–100 have been presented for illustration purposes only; it will be appreciated that the present invention is by no means limited to these example embodiments. Indeed, it is anticipated that systems for maintaining an electrical signal between a high and a low voltage of the invention will have utility when practiced with a wide variety of circuits of varying complexity. By way of a particular example, it is anticipated that the present invention will have great utility when used with integrated circuits of highly compact size, as maintenance of a signal between desired limits will be most advantageous for solving problems related to signal capacitance/conductance cross coupling.

Figure 11:
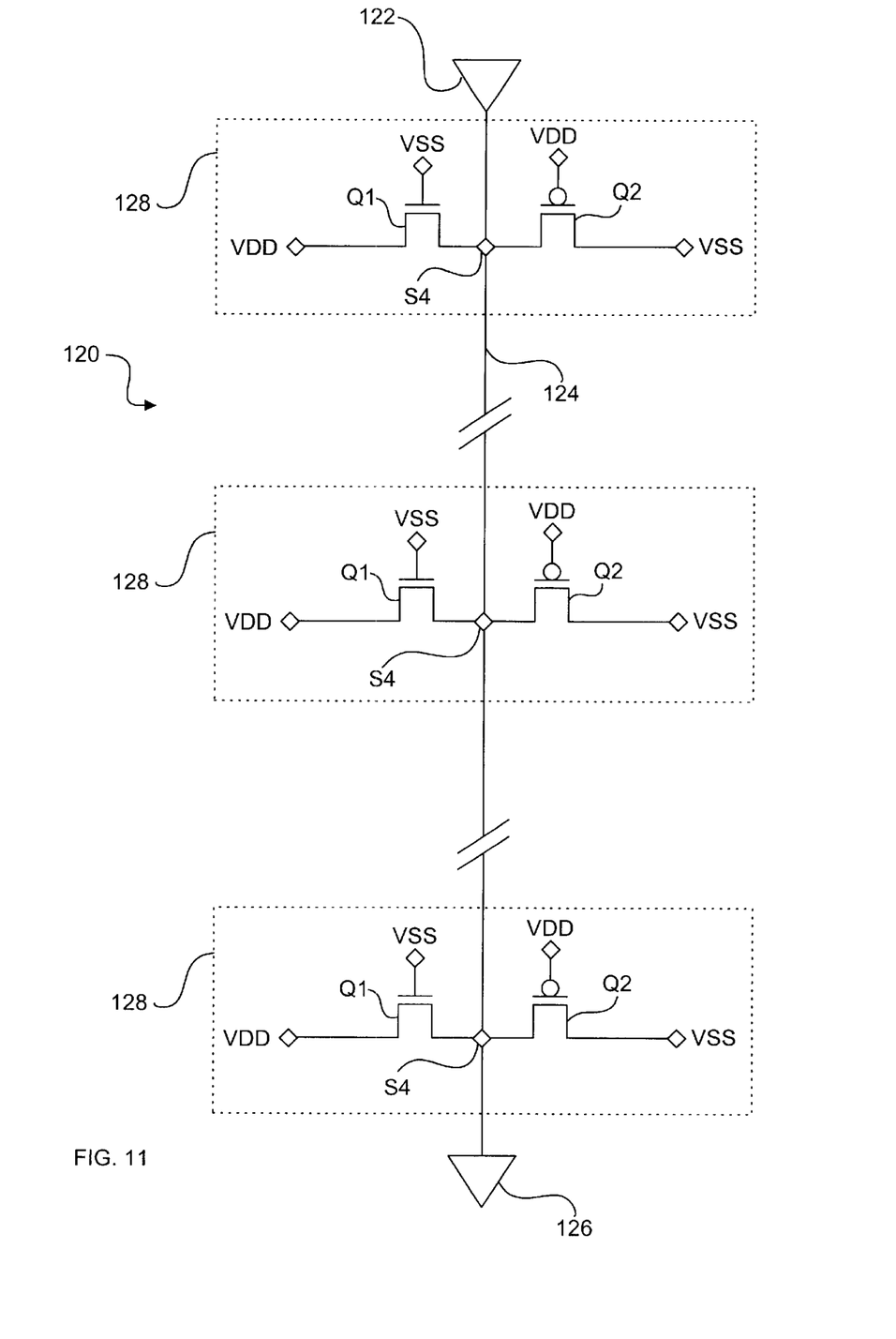
FIG. 11 is a schematic of an integrated circuit system embodiment of the invention.

FIG. 11 is a schematic illustrating an example integrated circuit embodiment 120 of the invention. The embodiment 120 comprises a driver circuit 122 connected by a signal path 124 to a receiver circuit 126. The signal path 124 may comprise, by way of example, a layer of deposited conductor such as a metal on a circuit chip. Although not illustrated in FIG. 11, the signal path 124 may be connected to any number of components or other circuits between the driver circuit 122 and the receiver circuit 126. Also, it will be appreciated that the driver circuit 122 and the receiver circuit 126 may comprise any of a multiplicity of particular circuits, and may comprise more than one circuit.

A plurality of level control sub-circuits 128 are connected to the signal path 124 between the driver circuit 122 and the receiver circuit 126. Each of the individual level control sub-circuits 128 operate to maintain a signal level between a high and a low level. Each of the sub-circuits 128 generally comprises a first switch Q1 and a second switch Q2 connected to a signal S4. The first switch is connected to a high voltage source VDD substantially equal to the high voltage level, and the second switch Q2 is connected to a low voltage source VSS substantially equal to the low voltage level. One of the first or second switches is biased on when the signal S4 drops below the low voltage level VSS, and the other switch is biased on when the signal S4 rises above the high voltage level VDD. The level control sub-circuits 128 connect with the signal path 124 between the FET Q1 and Q2, so that the signal S4 of the sub-circuits 128 lies along the signal path 124.

Accordingly, it will be appreciated that integrated circuit embodiments of the invention, with an example embodiment illustrated by FIG. 11, generally comprise a plurality of level control sub-circuits that are generally consistent with the level control circuit of the invention. That is, each of the individual level control sub-circuits that are comprised in an integrated circuit example of the invention may be thought of as level control circuits that have been described herein above and with reference to the example embodiments 10–100 of FIGS. 1–10, respectively.

Indeed, it will be appreciated that the each of the individual level control sub-circuits 128 of the integrated circuit 120 shown in FIG. 11 are consistent with the system 10 of FIG. 1. The switch Q1 comprises an n-channel FET with its gate connected to the low level voltage source VSS, and will normally be in an off position. The FET Q1 will be biased on when the signal measured at S4 drops below the low level voltage VSS less the threshold voltage of the FET Q1, whereby the signal S4 will be charged by the high level source VDD. The p-channel FET Q2 will normally be in an off state, but will be biased to on when the signal S4 level rises above the high level voltage VDD connected to its gate (plus the threshold voltage of the FET Q2). When in the on state, the FET Q2 will allow the signal to discharge to the low level voltage VSS. Operation of the sub-circuits 128 is summarized in Table 1. In general, each of the level control sub-circuits 128 operate to maintain (where VT is the threshold voltage of the respective FET):

$$(VDD+VT_{Q2}) \geq S4 \geq (VSS-VT_{Q1})$$

By distributing a plurality of the level control sub-circuits 128 along the signal path 124, the signal quality may be advantageously maintained at a plurality of locations. It will be appreciated that the signal may be desirably maintained at more than 3 locations as has been illustrated in FIG. 11. Indeed, for particular integrated circuits having "long runs" of a signal path, it may be desirable to provide numbers of level control sub-circuits 128 that number into the tens, hundreds, thousands, or more.

Also, it will be appreciated that the individual level control sub-circuits 128 may take many different configurations than illustrated by elements 128 in FIG. 11. By way of example, one or more of the individual level control sub-circuits 128 may take the form of any of the example circuits 20–100 illustrated in FIGS. 2–10, respectively. Further, the level control sub-circuits 128 are not required to be identical. By way of example, one of the sub-circuits 128 may be as shown, with a second configured consistent with the system 20 of FIG. 2, and a third configured consistent with the system 30 of FIG. 3.

Integrated circuit embodiments of the invention such as the circuit embodiment 120 thereby solve many problems of the prior art. For example, the plurality of level control sub-circuits 128 provides a mechanism for accurately and efficiently maintaining the level of the signal along the signal path 124 between desired high and low levels. Problems associated with cross-signal capacitive and inductive coupling can be substantially reduced or even eliminated.

The advantages of the disclosed invention are thus attained in an economical and practical manner. While preferred embodiments and example configurations have been shown and described, it is to be understood that various further modifications and additional configurations will be apparent to those skilled in the art. For example, although switches comprising transistors and more specifically field effect transistors have been discussed herein, the invention may be practiced with other types of transistors or with switches other than transistors. Indeed, it is intended that the specific embodiments and configurations herein disclosed are illustrative of the preferred and best modes for practicing the invention, and should not be interpreted as limitations on the scope of the invention as defined by the appended claims.

What is claimed is:

1. An integrated circuit capable of controlling the level of an electrical signal between a high and a low level, the integrated circuit comprising:
    a signal path for carrying the signal between a driver circuit and a receiver circuit; and
    a plurality of level control sub-circuits connected to said signal path, each of said plurality of level control sub-circuits comprising:
        an n-channel field effect transistor having its gate connected to a low voltage source substantially equal to the low level, having its drain connected to a high voltage source substantially equal to the high level, having its source connected to said signal path;
        a p-channel field effect transistor having its gate connected to said high voltage source, having its drain connected to said low voltage source, and having its source connected to said signal path; and,
        wherein said n-channel transistor will be biased on when said signal path is less than the low level and said signal path will be charged by said high voltage source, and wherein said p-channel transistor will be biased on when said signal path is greater than the high level and wherein said signal path will discharge to said low level voltage.

2. A system for controlling the level of an electrical signal between a high and a low level comprising:
    a first switch comprising an n-channel field effect transistor connected to the signal and having its gate connected to a low voltage source substantially equal to the low level and its drain connected to a high voltage source substantially equal to the high level;
    a second switch comprising a p-channel field effect transistor connected to the signal and having its gate connected to said high voltage source and its drain connected to said low voltage source;
    wherein said first switch is biased on when the signal is less than the low level wherein the signal will be charged by said high voltage source, and wherein said second switch is biased on when the signal is greater than the high level wherein the signal will discharge to said low voltage source, said first and second switches thereby operating to maintain the signal between the high and low levels.

3. A system for controlling the level of an electrical signal between a high and a low level comprising:
    a first switch comprising an n-channel field effect transistor having its gate connected to the signal and its drain connected to a high voltage source substantially equal to the high level;
    a second switch comprising an n-channel transistor connected to the signal and having its gate and its drain connected to a low voltage source substantially equal to the low level; and
    wherein said first switch is biased on when the signal is greater than the high level and wherein said second switch is biased on when the signal is less than the low level, said first and second switches thereby operating to maintain the signal between the high and low levels.

4. A system for controlling the level of an electrical signal between a high and a low level comprising:
    a first switch comprising a p-channel field effect transistor connected to the signal and having its gate and its drain connected to a high voltage source substantially equal to the high level;
    a second switch comprising a p-channel field effect transistor having its gate connected to the signal and its drain connected to a low voltage source substantially equal to the low level; and
    wherein said first switch is biased on when the signal is greater than the high level and wherein said second switch is biased on when the signal is less than the low level, said first and second switches thereby operating to maintain the signal between the high and low levels.

5. A system for controlling the level of an electrical signal between a high and a low level comprising:
    a first switch comprising an n-channel transistor having its drain connected to a high voltage source substantially equal to the high level and its gate connected to the signal;
    a second switch comprising a p-channel transistor having its drain connected to a low voltage source substantially equal to the low level and its gate connected to the signal; and
    wherein said first switch is biased on when the signal is greater than the high level and wherein said second switch is biased on when the signal is less than the low level, said first and second switches thereby operating to maintain the signal between the high and low levels.

6. A system for controlling the level of an electrical signal between a high and a low level comprising:
    a first switch comprising a p-channel field effect transistor connected to the signal and having its gate connected to a high voltage source substantially equal to the high level and its drain connected to a low voltage source substantially equal to the low level;
    a second switch comprising an n-channel transistor connected to the signal and having its gate and its drain connected to said low voltage source; and
    wherein said first switch is biased on when the signal is greater than the high level and wherein said second switch is biased on when the signal is less than the low level, said first and second switches thereby operating to maintain the signal between the high and low levels.

7. A system for controlling the level of an electrical signal between a high and a low level comprising:
- a first switch comprising a p-channel field effect transistor connected to the signal and having its gate connected to a high voltage source substantially equal to the high level and its drain connected to a low voltage source substantially equal to the low level;
- a second switch comprising a p-channel transistor having its gate connected to the signal and its drain connected to said low voltage source; and
- wherein said first switch is biased on when the signal is greater than the high level and wherein said second switch is biased on when the signal is less than the low level, said first and second switches thereby operating to maintain the signal between the high and low levels.

8. A system for controlling the level of an electrical signal between a high and a low level comprising:
- a first switch comprising a p-channel field effect transistor connected to the signal and having its gate and its drain connected to a high voltage source substantially equal to the high level;
- a second switch comprising a p-channel transistor connected to the signal and having its gate connected to a low voltage source substantially equal to the low level and its drain connected to said high voltage source; and
- wherein said first switch is biased on when the signal is greater than the high level and wherein said second switch is biased on when the signal is less than the low level, said first and second switches thereby operating to maintain the signal between the high and low levels.

9. A system for controlling the level of an electrical signal between a high and a low level comprising:
- a first switch comprising an n-channel field effect transistor having its gate connected to the signal and its drain connected to a high voltage source substantially equal to the high level;
- a second switch comprising an n-channel transistor connected to the signal and having its gate connected to a low voltage source substantially equal to the low level and its drain connected to said high voltage source; and
- wherein said first switch is biased on when the signal is greater than the high level and wherein said second switch is biased on when the signal is less than the low level, said first and second switches thereby operating to maintain the signal between the high and low levels.

10. An integrated circuit capable of controlling the level of an electrical signal between a high and a low level, the integrated circuit comprising:
- a signal path for carrying the signal between a driver circuit and a receiver circuit; and
- a plurality of level control sub-circuits connected to said signal path, each of said plurality of level control sub-circuits comprising:
  - first and second transistors, said signal path connected to said level control sub-circuit between said first and second transistors, said first transistor comprising an n-channel transistor connected to a high voltage source substantially equal to the high level and having its gate connected to a low voltage source substantially equal to the low level, said second transistor comprising a p-channel transistor connected to said low voltage source and having its gate connected to said high voltage source; and
  - wherein said first switch is biased on when the signal is below the low level wherein the signal will be charged by said high voltage source, and wherein said second switch is biased on when the signal is above the high level wherein the signal will discharge to said low voltage source.

* * * * *